United States Patent [19]

Yamaguchi

[11] Patent Number: 5,297,078
[45] Date of Patent: Mar. 22, 1994

[54] STATIC SEMICONDUCTOR MEMORY DEVICE FOR STABLE OPERATION

[75] Inventor: Takashi Yamaguchi, Tokyo, Japan
[73] Assignee: NEC Corporation, Tokyo, Japan
[21] Appl. No.: 897,774
[22] Filed: Jun. 12, 1992
[30] Foreign Application Priority Data
  Jun. 27, 1991 [JP] Japan ................... 3-183105
[51] Int. Cl.$^5$ .................................. G11C 7/00
[52] U.S. Cl. ............................. 365/149; 365/204; 365/189.11
[58] Field of Search ............ 365/149, 189.09, 189.11, 365/204, 206, 230.06, 190; 307/482, 578

[56] References Cited
U.S. PATENT DOCUMENTS

| | | | |
|---|---|---|---|
| 4,536,859 | 8/1985 | Kamuro | 307/578 |
| 4,612,462 | 9/1986 | Asano et al. | 307/578 |
| 4,697,252 | 9/1987 | Furuyama et al. | 365/149 |
| 4,896,297 | 1/1990 | Miyatake et al. | 365/189.11 |
| 5,113,374 | 5/1992 | Matsui | 365/204 |
| 5,214,601 | 5/1993 | Hidaka et al. | 365/206 |

Primary Examiner—Eugene R. LaRoche
Assistant Examiner—Vu A. Le
Attorney, Agent, or Firm—Sughrue, Mion, Zinn, Macpeak & Seas

[57] ABSTRACT

In a semiconductor memory device, when an AND gate is activated by an address line, an MOS transistor of an n-type channel QN1 is turned on. A potential of a word line WL related thereto is then set to substantially identical to a power source voltage Vcc. Simultaneously, a capacitor C1 connected to an output node of an inverter 104 starts a charging operation. The transistor QN1 is turned off and the potential of the word line WL is lowered. Consequently, the voltage substantially identical to the voltage Vcc is applied via a digit line DG1 or CDG1 to a flip flop circuit, which accordingly conducts a stable operation.

4 Claims, 3 Drawing Sheets

STATIC SEMICONDUCTOR MEMORY DEVICE FOR STABLE OPERATION

BACKGROUND OF THE INVENTION

The present invention relates to a semiconductor memory device, and in particular, to a semiconductor memory device of a static type.

DESCRIPTION OF THE PRIOR ART

There has been commonly known a semiconductor memory device of a static type in which a memory cell includes a flip flop circuit for storing therein data such that the data is retained therein while the memory cell is being supplied with a current.

FIG. 1 illustratively shows a portion of a conventional semiconductor memory device of a static type including a selector circuit for selecting a word line and peripheral elements of memory cells. The memory device of FIG. 1 includes a plurality of memory cells 10 and an NAND circuit 101 and an inverter 102 which constitute the circuit for selecting a word line.

The memory cells 10 are arranged in the form of a matrix. Each memory cell 10 memorizes and retains therein one-bit data while a current is kept supplied thereto. To the respective rows of the memory cells 10 are commonly connected word lines WL1, WL2, etc. as shown in FIG. 1. To the respective columns of the memory cells 10 are connected digit line pairs DG1 and CDG1, DG2 and CDG2, etc. Each of the word lines WL1, WL2, etc. is connected to an output node of the inverter 102. The inverter 102 has an input node connected to an output node of the NAND gate 101. Each NAND gate 101 is linked with a plurality of address lines 500. In response to a row address signal, either one of the NAND gates 101 specified by the row address signal is activated for operation. In consequence, either one of the word lines is driven by the inverter 102.

Moreover, when either one of the digit line pairs is specified by a column address, a memory cell is accordingly selected. Consequently, a data read or write operation is accomplished in the memory cell 10, for example, via the pair of digit lines DG1 and CDG1.

FIG. 2 is a block diagram showing an example of the memory cell 10, which is connected to a word line WL1 and a pair of digit lines DG1 and CDG1.

The memory cell 10 is configured in the form of a static memory cell 10 including a flip-flop circuit 210 constituted with metal-oxide semiconductor (MOS) transistors of an n-type channel QN6 and QN8 and resistor elements R1 and R2 each manufactured with a polycrystalline silicon and transfer gates QN5 and QN7.

One of the source or drain regions of the transistor QN5 is connected to the digit line DG1, whereas the other one thereof is connected to a memory node N1 and the transistor QN6. Moreover, the transistor QN5 has a gate region connected to the word line WL1, thereby configuring a transfer gate. Similarly, the transistor QN7 is also connected to the word line WL1, a memory node N2, and the transistor QN8, thereby constituting a transfer gate.

Gate and drain regions of the transistors QN6 and QN8 are mutually connected in a cross connection to form the flip flop circuit 210. The resistor elements R1 and R2 are disposed between a power source Vcc and the memory nodes N1 and N2, respectively. The resistor elements R1 and R2 have resistance values which respectively prevent the voltage levels retained at the memory nodes N1 and N2 from being altered by a leakage current. In general, the resistance values are set to a high value, for example, $10^{12}$ ohms to minimize a standby current. Consequently, in the memory cell 10 thus structured, data is supplied via the digit lines DG1 and CDG1 to the flip flop circuit 210 to be kept retained at the memory nodes N1 and N2.

Immediately after the data is written in the memory cell, the memory nodes N1 and N2 develop the following voltage values.

For example, when data "H" is to be stored in the memory cell 10, the voltage Vcc is applied to the digit line DG1 and the grounding potential is applied to the digit line CDG1. Furthermore, the potential of the word line WL1 is set to the voltage Vcc to turn the transfer gates, namely, the transistors QN5 and QN7 on. The memory node N1 develops a voltage $Vw_1 = Vcc - Vtn - V'$, whereas the node N2 is set to the grounding potential GND. In the expression above, Vtn represents a threshold voltage of the MOS transistor of an n-type channel and V' stands for a voltage increase associated with the threshold voltage of the transistor due to a substrate bias effect. For example, assuming Vcc=5 V, Vtn=0.7 V, and V'=0.8 V, the potential of the node N1 is about 3.5 V. Consequently, the voltage 3.5 V and the grounding potential are kept retained at the memory nodes N1 and N2, respectively. In this regard, the resistor element R1 has quite a high resistance and hence does not exert any substantial influence upon the voltage of the memory node N1 immediately after the write operation.

In consequence, in a case where the voltage Vcc is applied to the transfer gate, namely, the source region of the transistor QN5 or QN7, even when the voltage Vcc is applied to the gate region thereof, the potential of the drain region is set to a voltage lower than the voltage Vcc. Namely, the voltage applied to the flip flop circuit 210 is lower than the power source voltage Vcc.

However, in the conventional semiconductor memory device of a static type, when the voltage Vcc of the power source is decreased to an excessive extent, the power source voltage applied to the digit lines is also lowered and is passed through the respective transfer gates. As a result, the voltage of each digit line is further decreased due to the threshold voltage, namely, the resultant voltage attained by subtracting the voltage Vt from the voltage of the digit line. Thus, the voltage kept at each of the nodes N1 and N2 is much more reduced. Consequently, the potential difference between the memory nodes N1 and N2 is further lowered to quite a small value. This leads to a problem of unstable operation of the flip flop circuit 210 including the transistors QN5 and QN7.

SUMMARY OF THE INVENTION

It is therefore an object of the present invention to provide a semiconductor memory device of a static type which achieves a stable operation with a high reliability even when the power source voltage is lowered, thereby removing the drawbacks of the prior art.

According to the present invention, there is provided a semiconductor memory device of a static type achieving information read and write operations according to a content specified by an address, comprising memory cells which are connected to predetermined word lines respectively related thereto and which are connected to predetermined first and second digit lines respectively associated therewith, each said memory cell including a flip flop circuit for statically storing and keeping therein information, and word line selector circuits connected to predetermined word lines respectively associated therewith, each said word line selector circuit selecting one of the word lines related thereto in response to the address signal, each said word line selector including a booster circuit for increasing a voltage of the word line.

Furthermore, in accordance with the present invention, there is provided a semiconductor memory device of a static type achieving information read and write operations according to a content specified by an address, comprising memory cells which are connected to predetermined word lines respectively related thereto and which are connected to predetermined first and second digit lines respectively associated therewith, each said memory cell including a flip flop circuit for storing and keeping therein information and a first gate circuit and a second gate circuit which respectively connect the flip flop circuit to a first digit line and a second digit line in a respective manner according to a potential of the word line, and word line selector circuits connected to predetermined word lines respectively associated therewith, each said word line selector circuit selecting one of the word lines related thereto in response to the address signal, each said word line selector including a booster circuit for increasing a voltage of the word line, each said word line selector circuit controlling, when selected by the address signal, said first and second gate circuits according to a potential increased to a predetermined potential by said booster circuit, thereby connecting said flip flop circuit to said first and second digit lines.

In addition, in accordance with the present invention, there is provided a semiconductor memory device of a static type achieving information read and write operations according to a content specified by an address, comprising, memory cells which are connected to predetermined word lines respectively related thereto and which are connected to predetermined first and second digit lines respectively associated therewith, each said memory cell including a flip flop circuit for storing and keeping therein information and a first gate circuit and a second gate circuit which respectively connect the flip flop circuit to a first digit line and a second digit line in a respective manner according to a potential of the word line, and word line selector circuits connected to predetermined word lines respectively associated therewith, each said word line selector circuit selecting one of the word lines related thereto in response to the address signal, each said word line selector including a booster circuit for increasing a voltage of the word line to different levels for a write operation and a read operation, respectively.

In a semiconductor memory device of a static type according to the present invention, when a word line is activated in response to an address signal associated therewith, a booster circuit increases the potential on the word line to a voltage exceeding the power source voltage. The word line is connected to a first transfer gate and a second transfer gate, which pass the voltage of a first digit line directly to a drain region of a first field effect transistor. Consequently, the potential of the drain region of the first field effect transistor becomes to be substantially identical to that of the first digit line. Similarly, the second transfer gate also passes the voltage of a second digit line directly to a drain region of a second field effect transistor. As a result, even when the power source voltage is lowered, the potential of the drain region of the first field effect transistor is remarkably different from that of the drain of the second field effect transistor, which leads to a stable operation of the flip flop circuit.

Moreover, according to a semiconductor memory device of a static type according to the present invention, in a case where data is to be written in a memory cell and the power source voltage is lower than a predetermined voltage, the booster circuit sets the word line to a voltage higher than the power source voltage. Consequently, it is possible, by boosting the potential of the word line to a high voltage only in a write operation, to minimize the power consumed by the memory device.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring now to the accompanying drawings, description will be given of an embodiment of a semiconductor memory device of a static type in accordance with the present invention.

Figure 1:
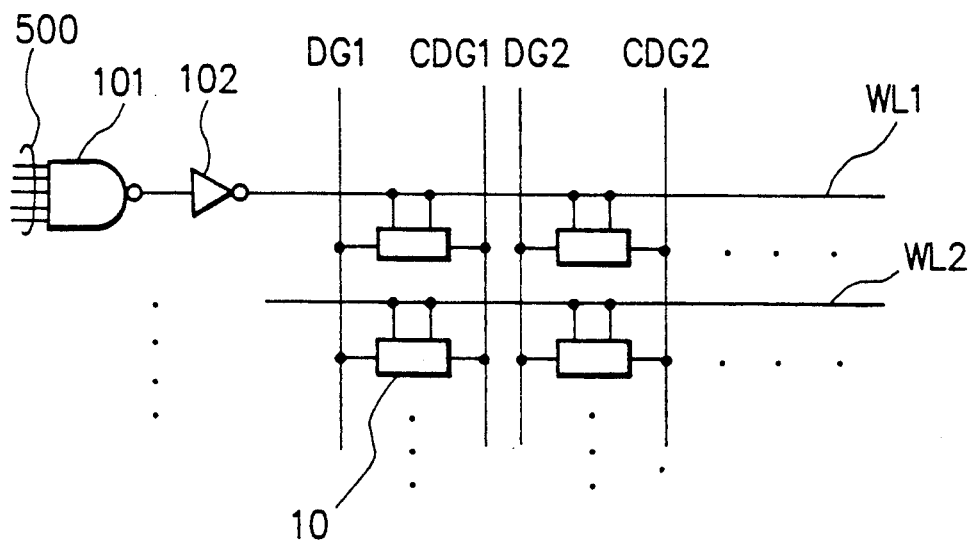
FIG. 1 is a circuit diagram showing the constitution of a semiconductor memory device of a static type of the prior art.
Figure 2:
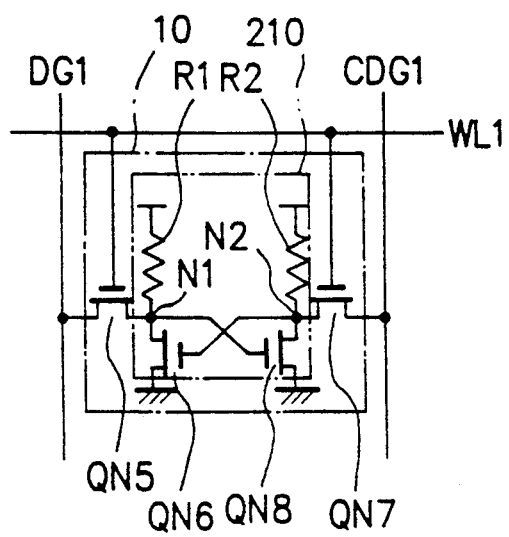
FIG. 2 is a circuit diagram showing the constitution of a memory cell in the static memory device.
Figure 3:
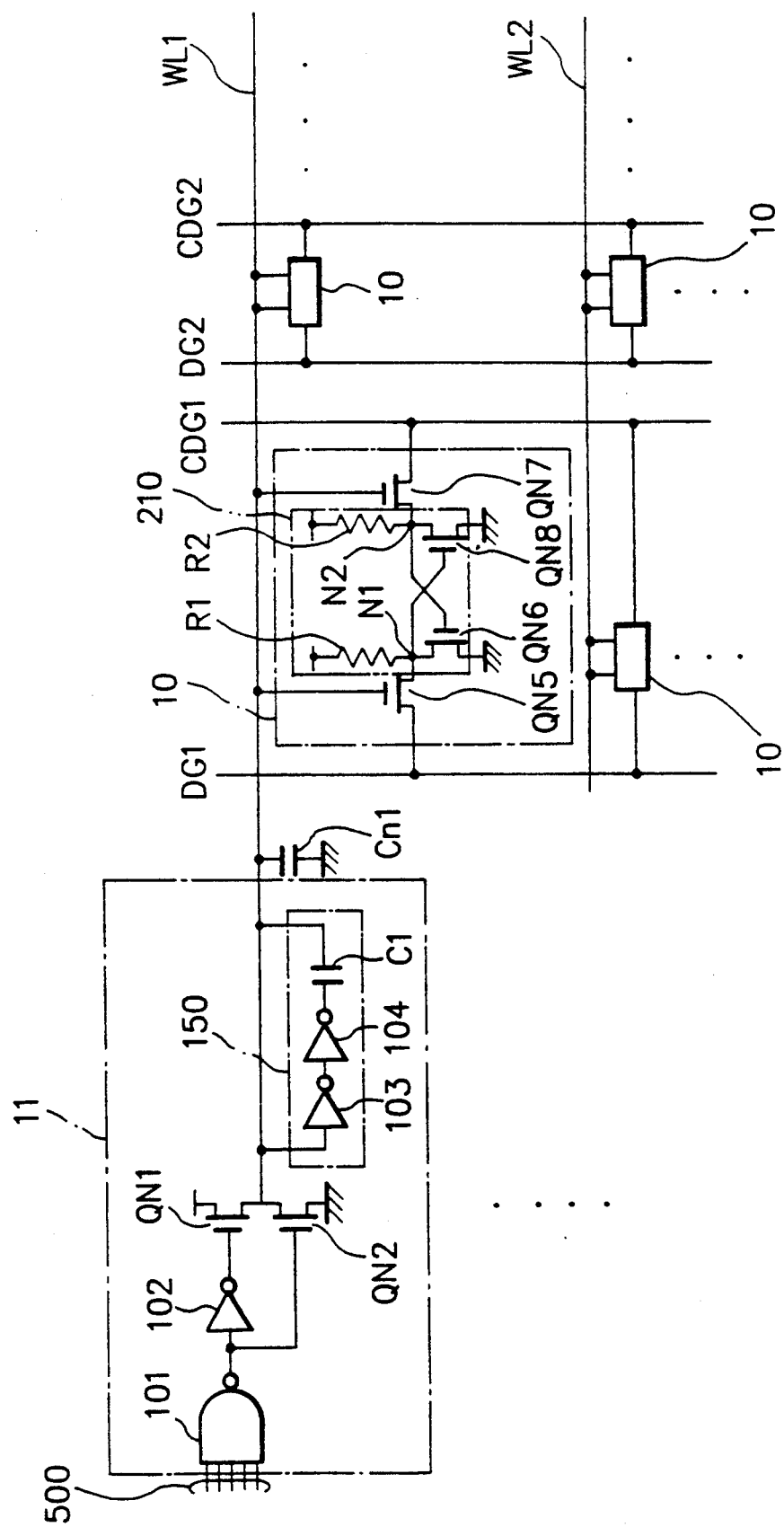
FIG. 3 is a schematic circuit diagram showing the configuration of a first embodiment of a semiconductor memory device of a static type in accordance with the present invention.

FIG. 3 shows the circuit configuration of a first embodiment of a static semiconductor memory device according to the present invention. In this memory device, information stored in a memory cell 10 is read therefrom or information is written therein in accordance with a content specified by an address signal. FIG. 3 includes only a portion of constituent elements directly related to the present invention; consequently, the other constituent elements are not shown in this diagram. As shown in the embodiment of FIG. 3, each word line WL is connected to a word line selector circuit 11, which includes a NAND gate 101, an inverter 102, two MOS transistors of an n-type channel QN1 and QN2, and a booster circuit 150.

The two transistors QN1 and QN2 are responsive to an output from the NAND gate 101 to set the word line WL to a Vcc level or a grounding potential level. The booster circuit 150 boosts or increases the voltage applied to the word line WL. This circuit 150 includes a capacitor C1 and two inverters 103 and 104, the inverters 103 and 104 being connected in series to each other. The booster circuit 150 is connected in parallel to the word line WL.

The NAND gate 101 has a plurality of input nodes. Some of these nodes are selectively supplied with an address signal. The remaining input nodes thereof are supplied with an inverted signal of the address signal. According to a predetermined combination of the address signal and the inverted signal on the address signal lines 500, the NAND gate 101 is activated to set an output node thereof to an "L" level. The output node is connected to an input node of the inverter 102 and a gate region of the transistor QN2. An output node of the inverter 102 is connected to a gate region of the transistor QN1. Consequently, when the NAND gate 101 is activated, the gate region of the transistor QN1 is set to an "H" level, namely, is turned ON. On the other hand, the gate region of the transistor QN2 is set to an "L" level, namely, an OFF state.

In consequence, immediately after the NAND gate 101 is selected, the voltage Vw1 of the word line WL is increased up to a voltage Vcc−Vtn−V', where Vcc stands for a voltage of the power source, Vtn denotes a threshold voltage of the transistor of an n-type channel, and V' indicates an increase in the threshold voltage of the transistor.

On the other hand, when the word line WL is changed from the grounding potential level to the level of Vcc−Vtn−V', the output node of the inverter 104 is also varied from the grounding potential level to the level of Vcc−Vtn−V'. At this moment, the capacitor C1 connected to the output node of the inverter 104 starts a discharge operation. Accordingly, the potential Vw1 of the word line WL connected to an electrode of the capacitor C1 starts increasing due to a bootstrap phenomenon. As a result, the transistor QN1 is turned off and the potential Vw1 of the word line WL is increased. Between the capacitor C1, a capacitor Cn1, the power source voltage Vcc, and the voltage Vw1 of the word line WL, there exists a relationship represented as $C1 \times Vcc = Cn1 \times Vw1$. For example, assuming C1=5 pF, Cn1=1.5 pF, and Vcc=5 V, the voltage Vw1 is obtained as 7.5 V. The capacitor Cn1 is implemented by a floating or parasitic capacitance between the potential of the word line WL and the grounding potential.

In the memory device of the first embodiment, when the power source voltage is decreased, the voltage of the digit line DG on the high-level side becomes lower than the power source voltage. Also in this case, since the potential Vw1 of the word line WL is boosted to a voltage higher than the power source voltage, there does not occur any voltage drop associated with the threshold voltage in the transfer gates QN5 or QN7. As a result, the transfer gates are completely turned on and the voltage of the digit line on the high-level side is applied to the memory nodes N1 and N2 without any voltage drop related to the threshold voltage. According to the embodiment above, there can be prevented the voltage drop in the transfer gates, namely, the transistors QN5 and QN7. That is, in this embodiment, a satisfactorily large voltage difference is produced between the memory nodes N1 and N2 thanks to the function of the booster circuit 150. The differential voltage is then applied to the flip flop 210. In consequence, even when the power source voltage Vcc is decreased, the flip flop 210 develops a stable operation.

Figure 4:
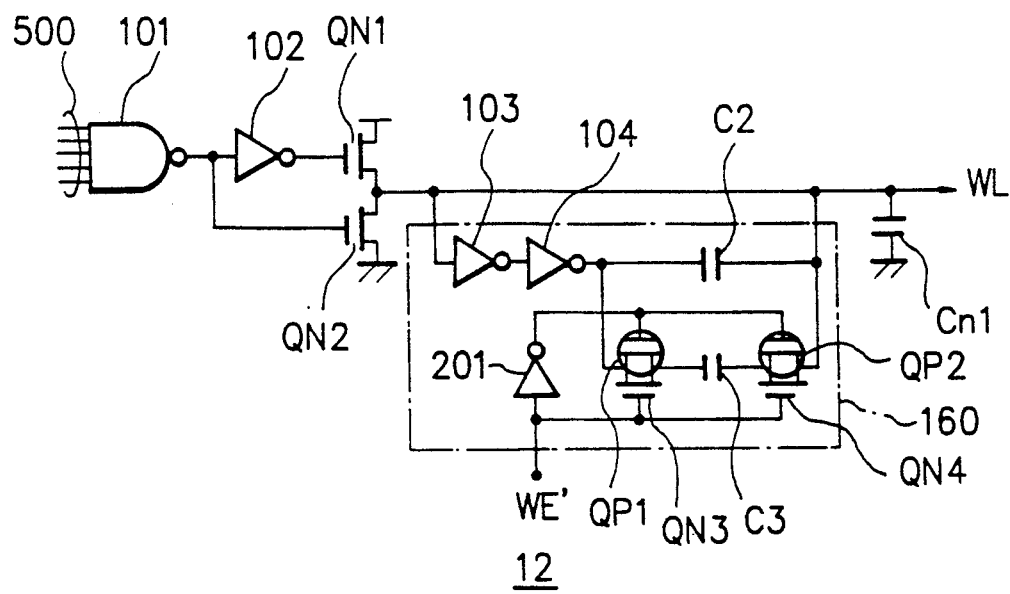
FIG. 4 is a circuit diagram showing the configuration of a second embodiment of a semiconductor memory device of a static type in accordance with the present invention.

FIG. 4 shows the constitution of a word line selector circuit 12 of a semiconductor memory device of a static type in a second embodiment of present invention including a first booster section and a second booster section. In this diagram, only a word line selector circuit 12 is shown; however, like the word line selector circuit 11, this circuit 12 is connected to each associated word line WL.

The selector circuit 12 of the second embodiment includes a booster circuit 160 in place of the booster circuit 150 of the selector circuit 11 used in the first embodiment. The booster circuit 160 is constituted with, in addition to the inverters 103 and 104 an inverter 201, MOS transistors QN3 and QN4 of an n-type channel, MOS transistors QP1 and QP2 of a p-type channel, and capacitors C2 and C3. Since the other constituent components are substantially the same as those of the selector circuit 11 of the first embodiment, description will be given primarily of the operational differences between these embodiments.

A write signal WE' is inputted to gate regions of the transistors QN3 and QN4, respectively. The write signal WE' is inverted by the inverter 201 to be delivered to gate regions respectively of the transistors QP1 and QP2. Consequently, the write signal WE' is set to an "L" level in the read operation of the memory cell 10. The transistors QN1, QN2, QP1, and QP2 are accordingly turned off and the capacitor C2 functions as a load of the inverter 104. On the other hand, when a write operation is accomplished in the memory cell 10, the write signal WE' is set to an "H" level. The transistors QN1, QN2, QP1, and QP2 are consequently turned on and the capacitors C2 and C3 function as the load of the inverter 104.

Assuming, for example, C2=1 pF, C3=0.5 pF, Cn1=1 pF, and Vcc=5 V, the potential Vw1 of the word line WL becomes to be 5.0 V and 7.5 V in the read and write operations, respectively. In consequence, according to the word line selector circuit 12 of the second embodiment, the potential Vw1 of the word line WL is increased only in the write operation, thereby minimizing the power consumption as compared with the word line selector circuit 11 of the first embodiment. In this regard, the potential Vw1 of the word line WL is thus boosted for the following reason. In an operation achieved to read the state of the flip flop circuit 210 (FIG. 3), the voltage drop in the power source voltage Vcc does not exert any substantial influence upon the operation of the flip flop circuit 210.

Figure 5:
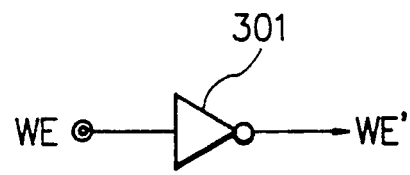
FIG. 5 is a circuit diagram schematically showing a circuit for generating a write signal WE' in the second embodiment of FIG. 4.
Figure 6:
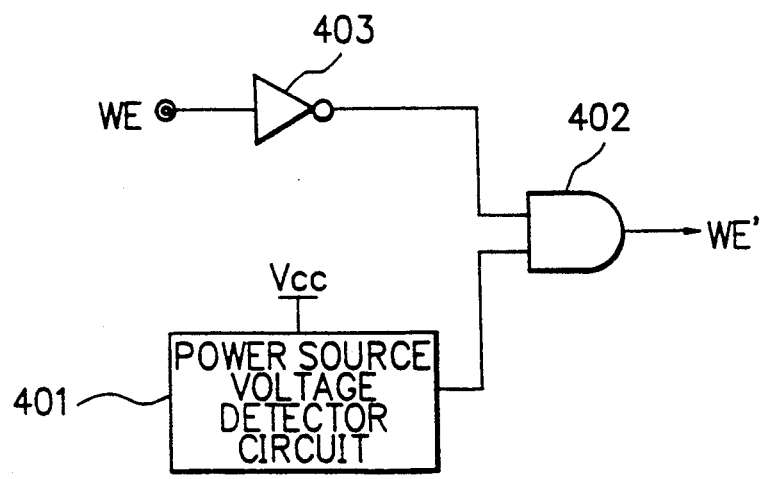
FIG. 6 is a diagram showing an alternative embodiment of a circuit for generating a write signal WE' in the second embodiment of FIG. 4.

FIGS. 5 and 6 show circuit configurations each for generating the write signal WE' of the second embodiment.

The generator circuit of FIG. 5 includes an inverter 301 for inverting the write inhibit signal WE received from a device external with respect to the memory device. The resultant signal is adopted as the write signal WE'.

The generator circuit of FIG. 6 includes an inverter 403, an AND gate 402, and a circuit 401 for detecting the power source voltage Vcc. When the voltage Vcc is reduced to be less than a preset voltage, for example, 4 V, the power source voltage detector circuit 401 outputs a signal having an "H" level to one of the input nodes of the AND gate 402. The remaining one of the input nodes is supplied with the inverted write inhibition signal. In consequence, only when the power source voltage Vcc is equal to or less than 4 V in a write operation, an output node of the AND gate 402, namely, the write signal WE' is set to an "H" level. As a result, the power consumed by the memory device can be minimized, which therefore mitigates the stress caused by a high value of the power source voltage Vcc.

As above, in the semiconductor memory device of a static type according to the present invention, the potential of the word line is boosted to a voltage higher than the power source voltage. This enables the flip flop circuit to develope a stable operation even when the power source voltage is lowered.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor memory device of a static type achieving information read and write operations according to a content specified by an address, comprising:

memory cells which are connected to a predetermined word lines respectively related thereto and which are connected to predetermined first and second digit lines respectively associated therewith, each said memory cell including a flip flop circuit for storing and keeping therein information and a first gate circuit and a second gate circuit which respectively connect the flip flop circuit to a first digit line and a second digit line in a respective manner according to a potential of the word line; and word line selector circuits connected to predetermined word lines respectively associated therewith, each said word line selector circuit selecting one of the word lines related thereto in response to the address signal by a voltage of said word line, each said word line selector including a booster circuit for increasing a voltage of the word line to produce a higher first level and a lower second level for a write operation and a read operation, respectively;

said booster circuit including:

a first booster section including two inverters and a capacitor connected in series thereto, the series connection of said two inverters and said capacitor being connected in parallel to the word line; and a second booster section including a second capacitor which is selectively connected to said first capacitor according to a write signal in a write operation.

2. A memory device as claimed in claim 1, wherein said second booster circuit comprises:

an inverter for inverting the write signal;

two MOS transistors of a p-type channel which are disposed on both sides of said second capacitor and which have gate regions connected to an output side of said inverter; and two MOS transistors of an n-type channel which are disposed on both sides of said second capacitor and which have gate regions for receiving the write signal.

3. A memory device as claimed in claim 1, wherein the write signal is attained by inverting the write inhibit signal by said inverter.

4. A memory device as claimed in claim 1, wherein the write signal is attained as a logical product between a signal developed by inverting the write inhibit signal by said inverter and a signal detected by a detector circuit for detecting a decrease in the voltage of the power source.

* * * * *